United States Patent
Bruel

(10) Patent No.: US 9,817,419 B2
(45) Date of Patent: Nov. 14, 2017

(54) METHOD FOR DETERMINING AN INDIVIDUAL POWER CONSUMPTION

(71) Applicant: Schneider Electric Industries SAS, Rueil Malmaison (FR)

(72) Inventor: Marc Bruel, Corenc (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 551 days.

(21) Appl. No.: 14/514,526

(22) Filed: Oct. 15, 2014

(65) Prior Publication Data

US 2015/0105926 A1    Apr. 16, 2015

(30) Foreign Application Priority Data

Oct. 16, 2013    (FR) ..................... 13 02399

(51) Int. Cl.
   *G05D 3/12*    (2006.01)
   *G05F 1/66*    (2006.01)
   *G01R 21/133*    (2006.01)
   *G01R 22/10*    (2006.01)
   (Continued)

(52) U.S. Cl.
   CPC ............. *G05F 1/66* (2013.01); *G01R 21/133* (2013.01); *G01R 22/10* (2013.01)

(58) Field of Classification Search
   CPC ........................................................ G05F 1/66
   (Continued)

(56) References Cited

U.S. PATENT DOCUMENTS

| 6,990,395 B2 * | 1/2006 | Ransom ............. G05B 19/4185 |
| | | 700/22 |
| 7,188,003 B2 * | 3/2007 | Ransom .................. H04L 63/20 |
| | | 700/22 |

(Continued)

FOREIGN PATENT DOCUMENTS

| CN | 202563077 | 11/2012 |
| FR | 2 984 516 A1 | 6/2013 |

(Continued)

OTHER PUBLICATIONS

Estrin, Deborah, et al. "Connecting the physical world with pervasive networks." IEEE pervasive computing 1.1 (2002): pp. 59-69.*

(Continued)

*Primary Examiner* — Satish Rampuria
(74) *Attorney, Agent, or Firm* — Oblon, McClelland, Maier & Neustadt, L.L.P.

(57) ABSTRACT

To determine a power consumption in a group of individual electric power distribution branches (3), a method includes the steps of:
   a) measuring the current (I) flowing in a main upstream line (2) and the voltage (U) of the main upstream line;
   b) measuring the voltage ($U_i$) of at least one branch, downstream of a circuit breaker (7) equipping each branch (3);
   c) determining the current ($I_i$) flowing through the branch based on the difference ($\Delta U_i$) between the upstream-downstream voltages;
   d) calculating the individual power consumption ($P_i'$) of the branch from the current and the voltage of the branch;
   e) calculating the general power (P) consumed by the group of branches from the current and the voltage of the main upstream line; and
(Continued)

f) correcting (F6) the individual power consumption ($P_i'$) so that an instantaneous electric power consumption variation observed at the level of the branch (3) is equal to an instantaneous electric power consumption variation simultaneously observed at the level of the main upstream line (2).

9 Claims, 7 Drawing Sheets

(58) Field of Classification Search
USPC .................................................. 700/275–306
See application file for complete search history.

(56) References Cited

U.S. PATENT DOCUMENTS

| | | | |
|---|---|---|---|
| 7,271,735 B2 * | 9/2007 | Rogai | G01D 4/004 324/110 |
| 7,761,910 B2 * | 7/2010 | Ransom | G06F 1/28 307/38 |
| 8,421,588 B1 * | 4/2013 | Ross | G08C 17/02 340/5.1 |

FOREIGN PATENT DOCUMENTS

| | | |
|---|---|---|
| JP | 2007-52006 | 3/2007 |
| JP | 2008-185435 | 8/2008 |

OTHER PUBLICATIONS

Shnayder, Victor, et al. "Simulating the power consumption of large-scale sensor network applications." Proceedings of the 2nd international conference on Embedded networked sensor systems. ACM, 2004.pp. 188-200.*

Chetty, Marshini, David Tran, and Rebecca E. Grinter. "Getting to green: understanding resource consumption in the home." Proceedings of the 10th international conference on Ubiquitous computing. ACM, 2008.pp. 242-251.*

* cited by examiner

METHOD FOR DETERMINING AN INDIVIDUAL POWER CONSUMPTION

BACKGROUND OF THE INVENTION

The invention relates to a method of determining an individual power consumption in an electric installation comprising a group of a plurality of branches of individual electric power distribution between a plurality of loads, as well as a main upstream line connecting the group of branches to an electric power supply.

The invention also relates to a system for monitoring an individual power consumption in an electric installation.

STATE OF THE ART

Individuals, as well as other economic agents, show an increasing interest for the control of their own electric power consumptions. An axis of this control relies on a detailed knowledge of different specific power consumptions within a general power consumption. For example, the inhabitants of a house may be interested in their electric power consumption due to heating, to that dedicated to lighting and/or that due to such and such equipment, without satisfying themselves with the sole knowledge of the general consumption at the scale of the house.

Currently, the inhabitants of a house or an apartment may have access to their general electric power consumption, by means of an electric power consumption meter equipping the line of connection to the public electric power distribution network. When an individual power consumption, for example, of equipment inside of the house, is desired to be known, the branch to which this equipment is connected is equipped with an electric power consumption meter.

Appended FIG. 1 is a diagram showing a current example of domestic electrical installation, where a plurality of electric power consumption meters 101 provide information relative to a plurality of individual power consumptions P1, P2, P3 constitutive of a general power consumption P.

In FIG. 1, reference 102 designates a transformer of connection to a public electric power distribution network. An upstream incoming feeder 103 connects transformer 102 to a plurality of electric power distribution outgoing feeders or branches 104. In the example of FIG. 1, only three branches have been shown. Branches 104 power loads 105 corresponding to the equipment of the house or apartment.

Upstream incoming feeder 103 is equipped with an electric power consumption meter 106. Each electric power distribution branch 104 is further equipped with an electric power consumption meter 101, identical or similar to meter 106. Each meter 101 or 106 determines a power consumption (individual or general), by measuring the current (I; $I_1$, $I_2$, $I_3$) and the voltage (U; $U_1$, $U_2$, $U_3$) of the line that it equips. A wire network is provided to convey the different meterings to an electronic measurement central unit 107, which gathers such meterings.

An electric power consumption meter is both expensive and bulky. When a plurality of individual power consumptions are desired to be monitored inside of an installation, the additional cost resulting from the multiplication of electric power consumption meters becomes significant and may be a real hindrance to the forming of an individual power consumption monitoring system. The possibility of such a multiplication of meters may further be limited by the lack of space available in many general electrical panels currently in service in individual houses or apartments.

It is thus needed to provide a compact and economical individual power consumption monitoring system.

Patent application FR2984516 describes a central unit for measuring individual powers, which partly addresses this need. This type of solution is commercialized by the applicant under designation BCPM (for "Branch Circuit Power Meter").

FIG. 2 schematically shows the BCPM multi-branch central measurement unit described in the previously-mentioned application.

As in FIG. 1, an electric power consumption meter 106 equips upstream incoming feeder 103. This meter measures general power supply voltage U, as well as the intensity and phase-shift values of general power supply current I. However, each distribution branch 104, the consumption of which is desired to be determined, is now equipped with a current sensor or ampere-meter 201, rather than another consumption meter.

Finally, a central measurement unit 202 collects and records along time the data originating from meter 106 and ampere-meters 201, and then calculates the different general or individual power consumptions based on these data.

The disadvantage of this solution is its still high cost (although a current sensor is less expensive than an electric power consumption meter) and the need to install a current sensor on each outgoing feeder. Indeed, when toroidal current sensors are used, such an installation requires dismounting the electrical panel of the house, to slip a toric current sensor around each outgoing feeder. Further, the space available in the panel is not always sufficient to install toroidal sensors. The use of openable sensors is not satisfactory either since they are even more expensive and bulky than toroidal sensors.

SUMMARY

The invention aims at further decreasing the cost of being informed of an individual electric power consumption constitutive of a general electrical power consumption, within an electric installation.

According to the invention, this object tends to be achieved by means of a method of determining a power consumption comprising the steps of:

a) measuring the current flowing in the main upstream line and the voltage of the main upstream line;

b) measuring the voltage of at least one individual distribution branch, downstream of a circuit breaker equipping the branch;

c) determining the current flowing in the individual distribution branch based on the difference between the voltage of the main upstream line and the voltage of the individual distribution branch;

d) calculating the individual power consumption of the individual distribution branch based on the current and on the voltage of the individual distribution branch;

e) calculating the general power consumed by the group of branches based on the current and the voltage of the main upstream line; and f) correcting the individual power consumption so that an instantaneous electric power consumption variation observed at the level of the individual distribution branch is equal to an instantaneous electric power consumption variation simultaneously observed at the level of the main upstream line.

The invention aims at a simplified individual power consumption monitoring system, to decrease the cost and the bulk thereof and make its installation in an electrical panel easier.

According to the invention, this object tends to be achieved by providing:

a device for measuring the current and the voltage at the level of the main upstream line and for measuring the voltage of at least one individual distribution branch downstream of the circuit breaker, a meter of the general power consumed by the group of branches based on the current and the voltage of the main upstream line;

a calculation device configured to calculate the individual power consumption of the individual distribution branch based on a current flowing through the individual distribution branch and a voltage of the individual distribution branch; and means for correcting the individual power consumption, by correlation of the instantaneous electric power consumption variations simultaneously observed at the level of the individual distribution branch and of the main upstream line.

The calculation device is configured to calculate the current of the individual distribution branch based on the difference between the voltage of the main upstream line and the voltage of the individual distribution branch.

BRIEF DESCRIPTION OF THE DRAWINGS

The foregoing and other features and advantages will more clearly appear from the following non-limiting description of specific embodiments in connection with the accompanying drawings, among which.

DESCRIPTION OF A PREFERRED EMBODIMENT

Figure 1:
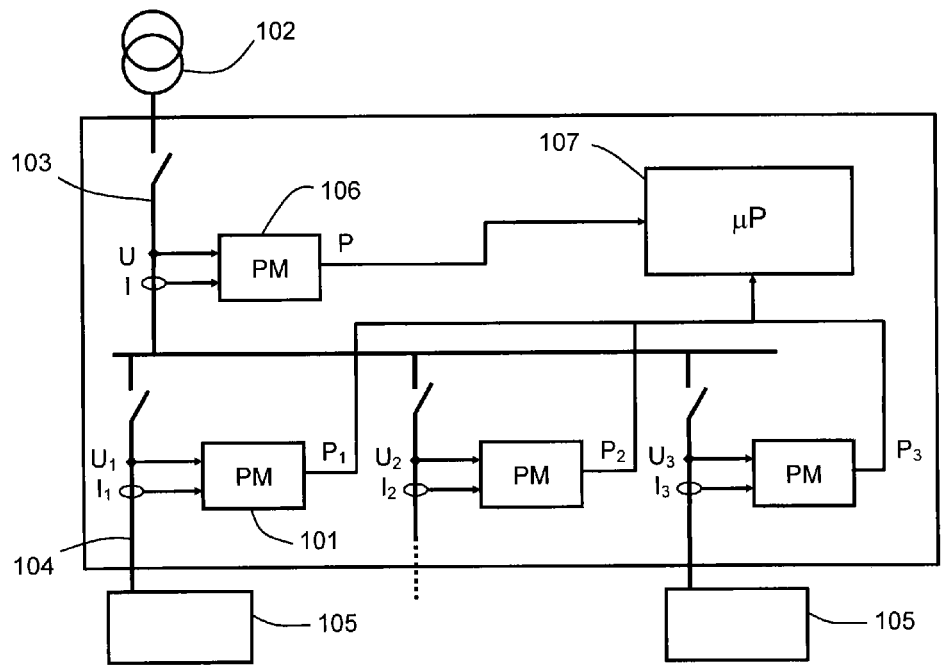
FIG. 1, previously described, is a simplified electric diagram of an electric installation equipped with a power consumption monitoring system according to prior art.
Figure 2:
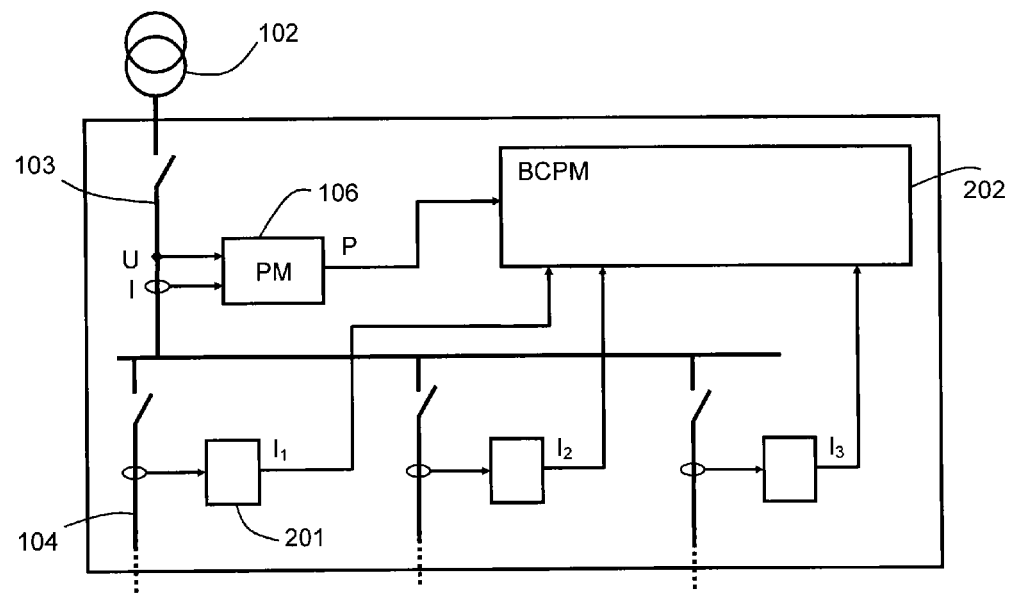
FIG. 2, previously described, schematically shows another power consumption monitoring system according to prior art, in the electric installation of FIG. 1.
Figure 3:
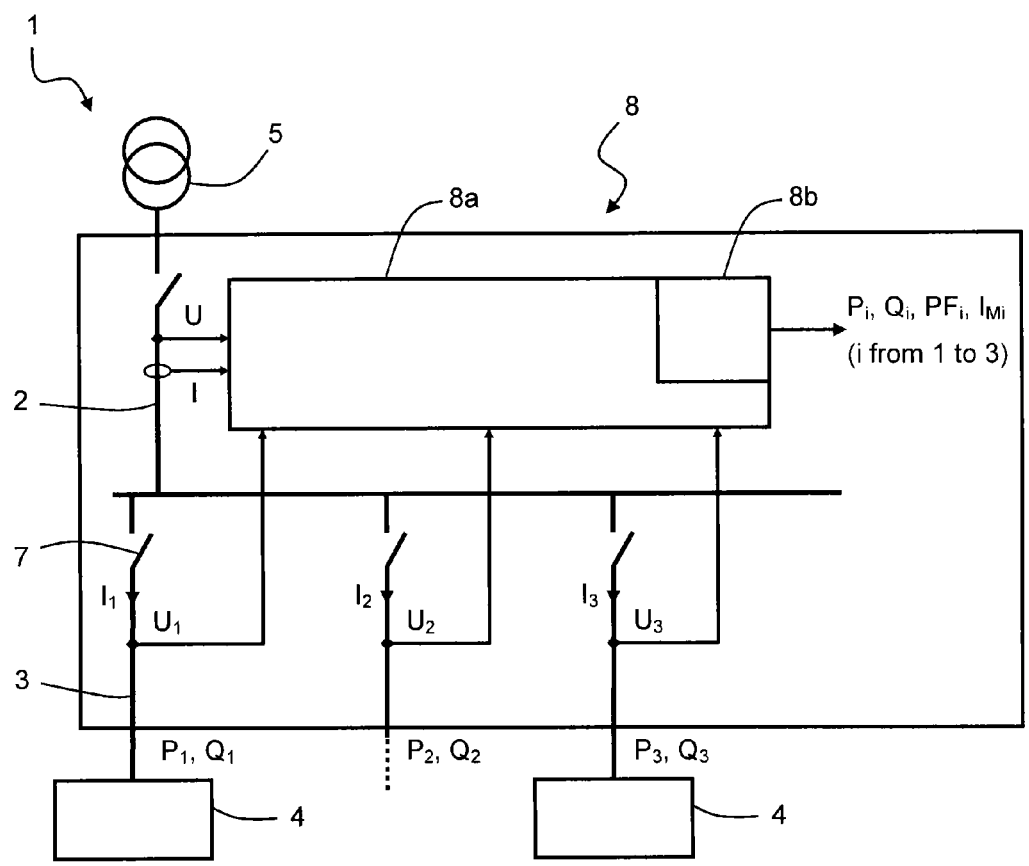
FIG. 3 schematically shows an individual power consumption monitoring system according to the invention.

FIG. 3 shows an electric installation 1 capable of monitoring individual electric power consumptions. For clarity, FIG. 3 is simplified and certain conventional components of the installation are omitted therein. In particular, a single phase conductor is shown, while the neutral conductor is not.

Electric installation 1 may belong to a final electric power consumer and be located in a building, such as an individual house or apartment or an office building, where there exist a plurality of different loads to be powered and where an electric power distribution is to be performed.

Electric installation 1 conventionally comprises a main upstream line or incoming feeder 2 and a group of individual electric power distribution branches 3 connected to incoming feeder 2. Branches 3 power loads 4 corresponding to the building equipment.

Installation 1 is connected to an A.C. or D.C. current electric power supply 5 by incoming feeder 2. Power supply 5 may particularly be a public electric power distribution network.

Incoming feeder 2 emerges in a general low-voltage panel 6, where a plurality of outgoing feeders are connected to incoming feeder 2. Each of them belongs to one of distribution branches 3 which scatter in the building. In the example of FIG. 3, branches 3 are by the number of three. It should be obvious that their number may be different from three.

Each outgoing feeder 3 is equipped with a circuit breaker 7 enabling to interrupt the power supply of load 4, particularly in the occurrence of an over-voltage or of a breakage of the neutral conductor. In closed position, this circuit breaker has a low impedance, mainly resistive, in the order of 10 m$\Omega$.

To minimize the equipment necessary to determine an electric power consumption in one of individual distribution branches 3, it is provided to exploit the voltage drop which appears across circuit breaker 7 equipping this branch.

Indeed, it has been observed that circuit breaker 7 behaves as a "shunt" resistance in closed position. The voltage drop in circuit breaker 7 varies almost linearly along with the current flowing therethrough. Accordingly, the measurement of the voltages upstream and downstream of circuit breaker 7 enables to estimate the current flowing in branch 3, and then the electric power consumed by this branch.

FIG. 3 schematically shows an individual power consumption monitoring system 8, which applies this principle in electric installation 1. The branches are here numbered from 1 to 3. $U_i$ and $I_i$ respectively designate the voltage and the current of a branch of rank i (with i ranging from 1 to 3).

In A.C. state, active power $P_i$ should be distinguished from reactive power $Q_i$ consumed by the individual distribution branch of rank i. The monitoring system 8 described hereafter is capable of measuring one or the other of these two quantities which characterize the electric power delivered by the branch, or even both simultaneously. In D.C. state, this distinction does not exist and the system will determine the electric power $P_i$ of one or a plurality of branches.

Monitoring system 8 comprises equipment 8a for measuring current I flowing in incoming feeder 2, voltage U of incoming feeder 2, and voltage $U_i$ of at least one distribution branch 3, downstream of circuit breaker 7. The measurement system is thus comprised of at least one current sensor, one voltmeter, and two wires connecting the voltmeter to main line 2 and to one of branches 3 downstream of circuit breaker 7.

As shown in FIG. 3, measurement equipment 8a advantageously comprises as many connection wires as there are branches 3, to measure the voltage of all branches. In this example, three voltage values $U_1$, $U_2$ and $U_3$ are then available. As compared with general power supply voltage U, these values will enable to calculate currents $I_1$, $I_2$, and $I_3$ of the three distribution branches, and then their respective power consumptions $P_1/Q_1$, $P_2/Q_2$, and $P_3/Q_3$.

System 8 further comprises a calculation device 8b, configured to calculate active power $P_i$ and/or reactive power $Q_i$ consumed by a branch of index i based on voltage values U, $U_i$, and current value I. In addition to active power $P_i$ and reactive power $Q_i$, calculator device 8b is capable of calculating power factor $PF_i$ (in A.C. state only) of branch i and a mean value $I_{Mi}$ of the current flowing in this branch (A.C. or D.C. mode).

Figure 4:
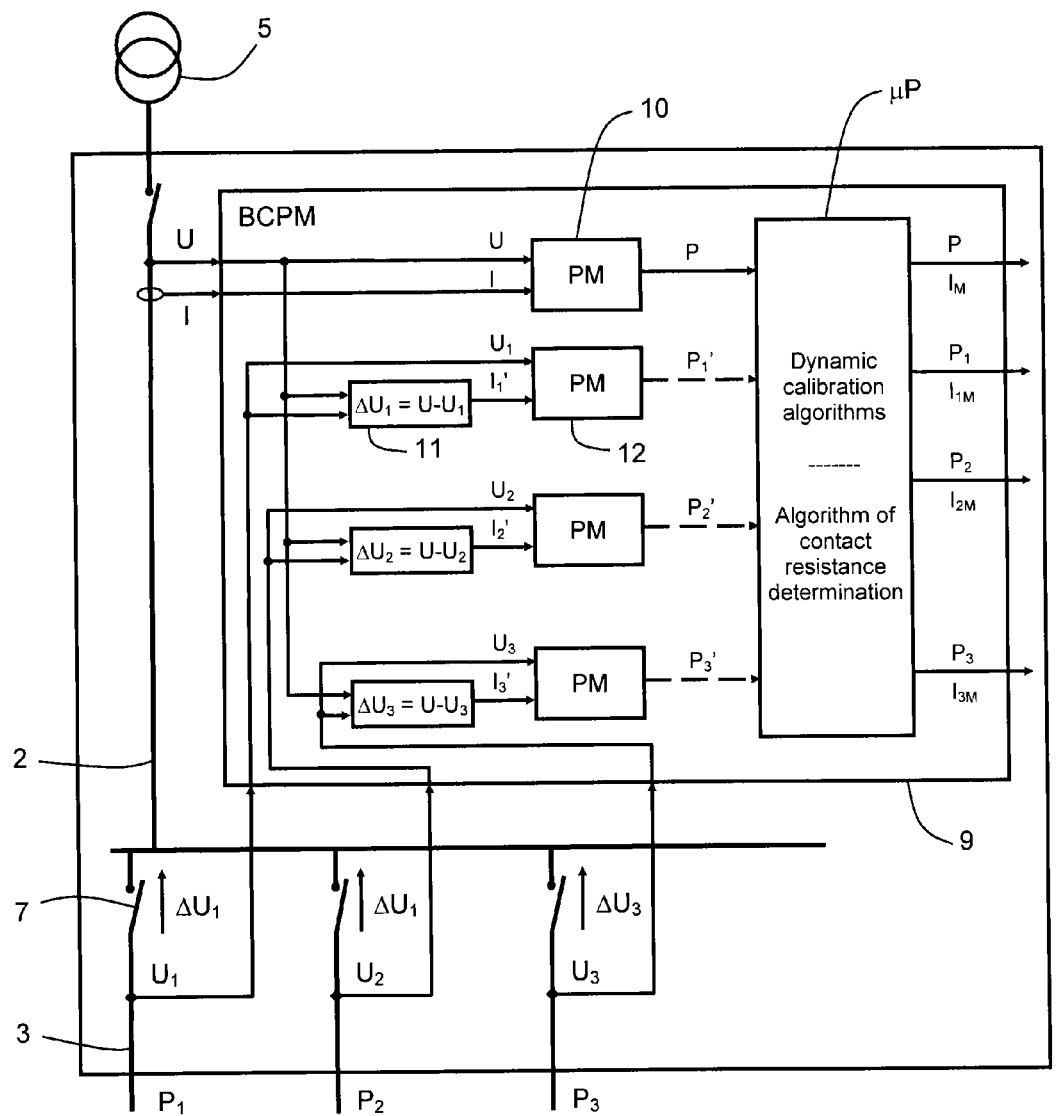
FIG. 4 shows a preferred embodiment of the monitoring system according to the invention.

FIG. 4 shows in detail a preferred embodiment of individual power consumption monitoring system 8. In this preferred embodiment, part of the measurement equipment and the calculator are gathered in a same electronic system to form a single device 9, called BCPM ("Branch Circuit Power Meter").

Incoming feeder 2 is equipped with a current sensor, to measure current I flowing therethrough. Due to current I and voltage U of incoming feeder 2, central unit 9 determines the general power P consumed by the group of branches. An electric power consumption meter 10, such as that used in prior art solutions, may be provided for this purpose.

In this preferred embodiment, electric power consumption meter 10 is integrated to central measurement unit 9. Thus, two of the inputs of central unit 9 are provided for voltage U and current I of incoming feeder 2 and connected to meter 10.

In the example of FIG. 4, central unit 9 has three other inputs, corresponding to voltage taps $U_1$, $U_2$, and $U_3$ in the three distribution branches 3. Each of these inputs has a comparator 11 connected thereto. There thus are as many comparators 11 as distribution branches 3.

Each comparator 11 is configured to calculate voltage drop $\Delta U_i$ across circuit breaker 7 of branch 3 to which it is associated. This voltage drop is equal to the difference between "upstream" voltage U of incoming feeder 2 and "downstream" voltage $U_i$ of branch 3. Thus, each comparator 11 receives voltage U and one of voltages $U_1$, $U_2$, and $U_3$ as an input. As an example, comparator 11 associated with the branch of rank 1 calculates voltage drop $\Delta U_1$ from voltages U and $U_1$ ($\Delta U_1 = U - U_1$).

Voltage drop $\Delta U_i$ is generally proportional to current $I_i$ flowing in a branch. Each comparator 11 outputs an image $I_i'$ of the current flowing through the associated branch, by dividing voltage drop $\Delta U_i$ by a value typical of the shunt resistance of circuit breaker 7. The image currents of the three branches are noted $I_1'$, $I_2'$, and $I_3'$ in FIG. 4.

Each comparator 11 has an electric power calculation unit 12 connected to its output. Each calculation unit 12 receives voltage $U_i$ and image current $I_i'$ of the branch for which the individual power consumption $P_i'$ is desired to be determined. Three calculation units 12 are thus provided to calculate power consumptions $P_1'$, $P_2'$, and $P_3'$ of the three distribution branches 3.

Preferably, calculation units 12 are, in their forming, identical or similar to electric power consumption meter 10.

Electric power values $P_1'$, $P_2'$, and $P_3'$ at the output of calculation units 12 are approximate, since they are based on an estimate of the current ($I_i'$) in distribution branches 3, and more particularly on the equivalent resistance of circuit breakers 7. Now, such a resistance varies along time, particularly due to the successive openings/closings of the circuit breaker, to the wearing of the circuit breaker contacts along time, and to the heating of these contacts by Joule effect.

To take into account this variation and make the calculation of the individual power consumption more accurate, monitoring system 8 performs a correlation between approximate individual power values $P_1'$, $P_2'$, $P_3'$ and the accurate measurement of general power P performed by meter 10.

Power consumptions P, $P_i'$ calculated by meter 10 and calculation units 12 supply a microprocessor μP. Microprocessor μP is preferably equipped with a memory where it records, among others, a plurality of values of these powers and currents spread over time.

Calibration algorithms are also stored in the memory. As will be described hereafter, microprocessor μP implements these algorithms to correct the approximate values of individual power consumptions $P_i'$, into accurate values $P_i$.

In addition to central unit 9 and to the current/voltage sensors equipping incoming feeder 2, monitoring system 8 only requires one voltage tap at the level of individual distribution branch 3 to determine its power consumption. Now, a voltage tap is much less constraining than the use of a current sensor. It comes down to a single wire, while a current sampling requires at least two wires, one sensor, and wiring operations.

The measurement tools of monitoring system 8 are thus simplified as compared with conventional monitoring systems, which use a power consumption meter or a current sensor in each distribution branch. Its arranging in an electric installation is thereby greatly eased.

Further, the wire used for a voltage sampling has a smaller cross-section than the wires of a current sensor. Accordingly, this monitoring system is compact and adapted to electrical panels where there is little available room.

Thus, the monitoring system of FIG. 4 is much less expensive and bulky than conventional monitoring systems. As an example, in a three-phase electric installation with eight distribution branches, monitoring system 8 only requires a single device (central unit 9), three current sensors (1 per phase of the upstream incoming feeder), and 27 voltage taps (3 upstream and 24 downstream). The system of application FR2984516 requires three voltage sensors (upstream) and 27 current sensors (3 upstream and 24 downstream), in addition to the BCPM central measurement unit. Finally, multiplying the electric power consumption meters, there should be nine meters (1 per line/branch), 27 current sensors, and 27 voltage sensors (3 per line/branch).

The above-described monitoring system is adapted to any type of electric installation, particularly with a D.C. current or an A.C. current (sinusoidal, for example), a single-phase or three-phase installation. In A.C. mode, it takes into account the phase shift between the current and the voltage, in order, particularly, to determine the active and reactive power consumptions.

Apart from the power consumption, the system can provide an indication of the state of the circuit breaker of a branch: open or closed. Indeed, if upstream-downstream voltage difference $\Delta U_i$ is low, in the order of 100 mV, the circuit breaker is in the closed state. Such a voltage difference corresponds to the "shunt" resistance of the circuit breaker. When the circuit breaker opens, for example, due to a triggering, voltage $\Delta U_i$ measured across the circuit breaker becomes equal to the nominal power supply voltage, for example, 230 V. In this second case, current image $I_i'$ provided by comparator 11 will obviously be false. However, since downstream voltage $U_i$ is zero, the calculated individual power $P_i'$ will also be zero, which is a coherent result.

Figure 5:
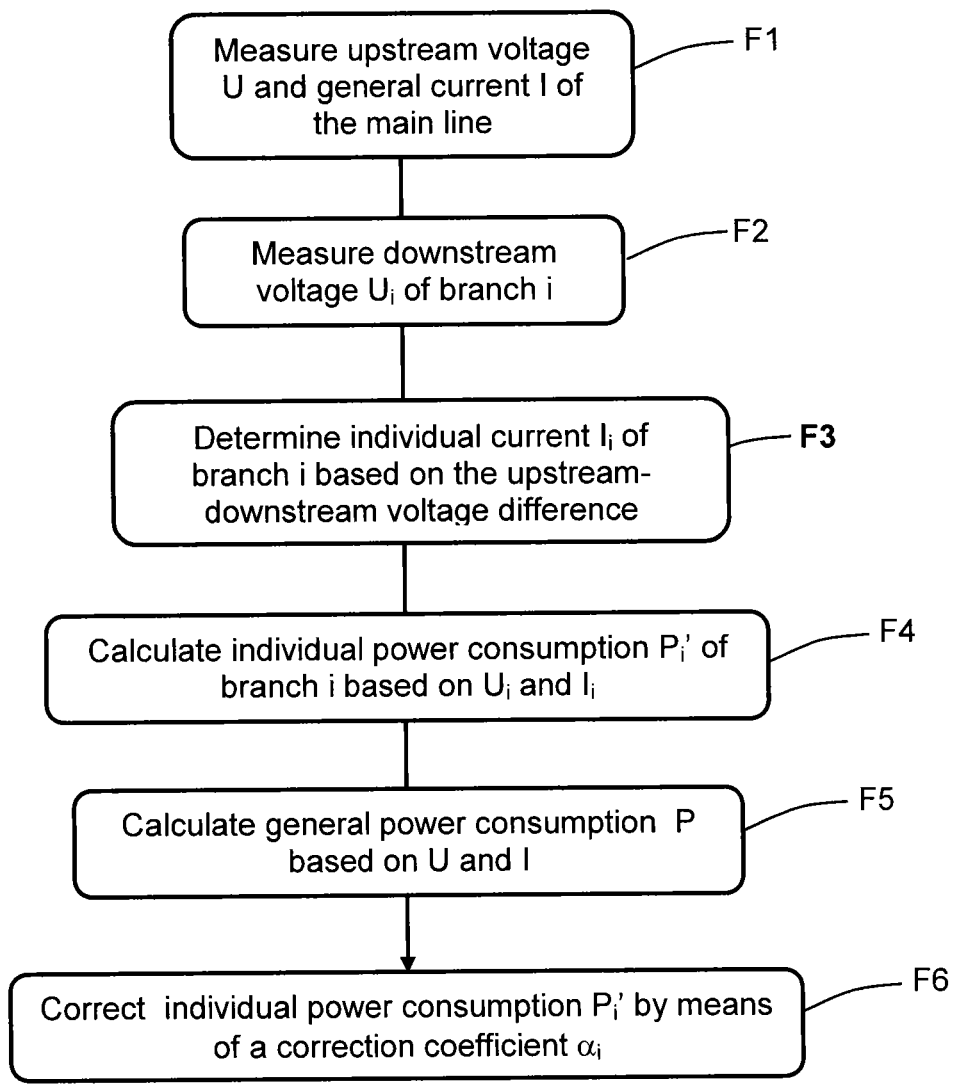
FIG. 5 shows the steps of a method implemented by the monitoring system according to the invention, to determine the power consumption of an individual electric power distribution branch.

FIG. 5 summarizes steps F1 to F6 of the method implemented by the monitoring system of FIG. 4, to determine one or a plurality of individual power consumptions.

At a first step F1, voltage U and current I of main line 2 upstream of the installation are measured.

Then, at a step F2, voltage $U_i$ of distribution branch 3, the consumption of which is desired to be determined, is measured downstream of circuit breaker 7.

At step F3, the monitoring system determines an approximate value of current $I_i$ flowing in circuit breaker 7 and distribution branch 3, based on the difference between values U and $U_i$.

At F4, an approximate value $P_i'$ of the electric power consumed by branch 3 is determined, knowing voltage $U_i$ and current $I_i$.

At step F5, the general power P consumed by branch group 3 is determined based on general current I and on general power supply voltage U (measured at step F1).

Finally, step F6 comprises individually correcting each power consumption Pi' to compensate for the lack of accuracy due to the image of the current. To achieve this, a correction coefficient $\alpha_i$ is defined for each distribution branch, and is multiplied by power consumption $P_i'$ of the branch.

$$P_i = P_i' \times \alpha_i$$

Such a correction coefficient $\alpha_i$ is specific to each distribution branch 3. At the first starting of the monitoring system, its value is equal to 1. Then, over time, it is updated by microprocessor μP. The initial and current values of correction coefficient $\alpha_i$ are stored, for each branch, in the memory of microprocessor μP.

The current value of coefficient $\alpha_i$ is determined by an algorithm, which compares instantaneous electric consumption variations simultaneously observed at the level of main upstream line 2 and at the level of distribution branch 3. Correction coefficient $\alpha_i$ is calculated so that a power variation in distribution branch 3 is equal to the power variation in main upstream line 2.

Figure 6:
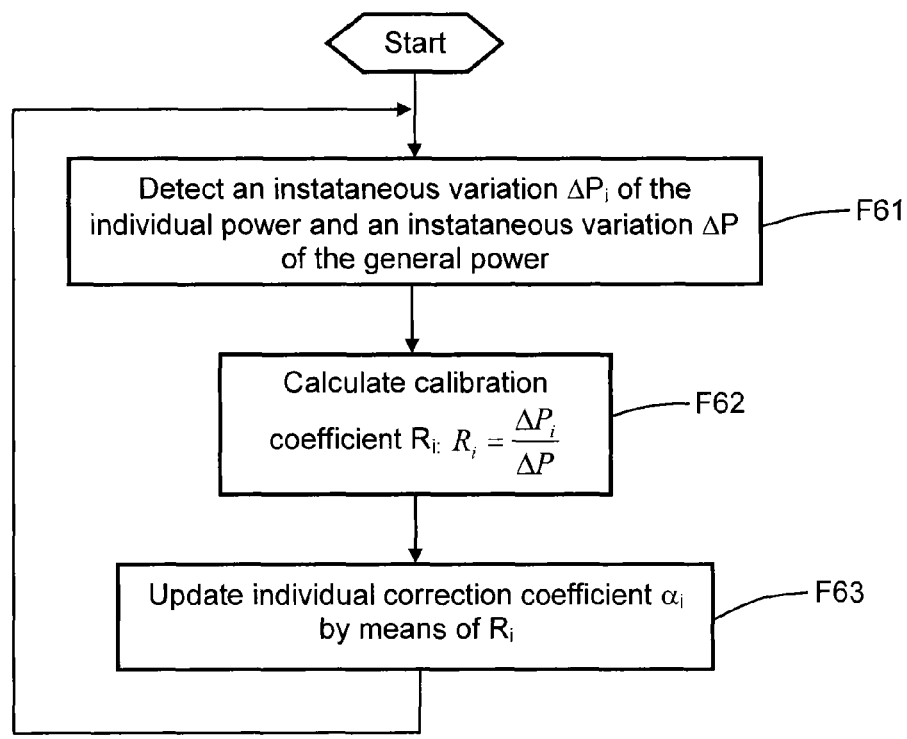
FIG. 6 shows a correction algorithm implemented in the monitoring system of FIG. 4, to refine the calculation of the individual power consumption.

FIG. 6 shows, in the form of a flowchart, the algorithm implemented by the microprocessor, to determine the value of correction coefficient $\alpha_i$ to be applied at step F6.

The algorithm of FIG. 6 comprises three steps F61 to F63 which are preferably implemented after each closing of circuit breaker 7, that is, as soon as an electric current is restored in distribution branch 3. Thus, the variation of the contact resistance of the circuit breaker can be taken into account in the calculation of the power consumption.

At a step F61, the monitoring system monitors all the individual powers $P_i$ corrected at step F6, until it detects a variation $\Delta P_i$ of one of its distribution branches. A variation ΔPi of the individual power is preferably detected as soon as it exceeds a detection threshold, for example, 5% of the nominal power consumed by this branch. Simultaneously, the system detects a variation of general power P, noted ΔP.

Such a monitoring is preferably performed continuously by microprocessor μP, since it records over time the general and corrected individual power values P and $P_i$.

At step F62, a calibration coefficient $R_i$ is calculated by microprocessor μP. Coefficient $R_i$ is equal to the ratio of the individual power variation, $\Delta P_i$, to the general power variation, $\Delta P$:

$$R_i = \frac{\Delta P_i}{\Delta P}$$

At F63, the individual correction coefficient is updated by means of calibration coefficient $R_i$ calculated at step F62. A new value $\alpha_i'$ of the coefficient is calculated, by dividing the existing value $\alpha_i$ by coefficient $R_i$ calculated at step F62:

$$\alpha_i' = \frac{\alpha_i}{R_i} \quad (1)$$

Finally, new value $\alpha_i'$ of the correction coefficient replaces the old value $\alpha_i$ in the memory.

Of course, after the updating of correction coefficient $\alpha_i$ at step F63, the estimated value $P_i'$ of the individual power is corrected again:

$$P_i = P_i' \times \alpha_i$$

The algorithm of FIG. 6 enables, in a way, to calibrate the shunt resistance of a circuit breaker, assuming that a general power variation is caused by an identical variation of the power of a distribution branch. This algorithm can thus only be applied if a single one of the branches sees its consumption vary at a given time. If the powers of two branches vary simultaneously, it is no longer possible to differentiate them and to assign them to the general power variation. In this case, steps F62 to F63 are postponed until a branch stands out from the rest of the group.

Since it is performed on each power variation in the individual distribution branch, this calibration can be called dynamic.

The algorithm of FIG. 6 may be implemented once for each distribution branch on initialization of the monitoring system, after it has been connected to the electric installation. The circuit breakers of all branches are then opened, and closed back, one after the other to force power variations. Then, the algorithm initiates for each branch. The appearing of spontaneous variations may also be awaited.

Figure 7:
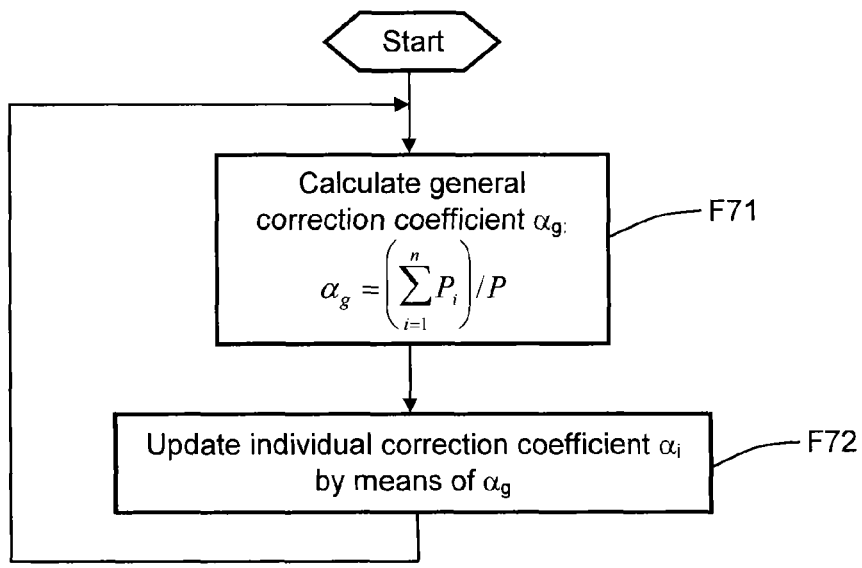
FIG. 7 shows another individual power consumption correction algorithm.

In a preferred embodiment, each update of coefficient $\alpha_i$ at step F63 is followed by another calibration algorithm. This second algorithm is shown in FIG. 7 and comprises steps F71 and F72. It uses, for each distribution branch, the same correction coefficient $\alpha_i$ as that used for the algorithm of FIG. 6.

Unlike that of FIG. 6, the calibration of FIG. 7 is performed at the scale of the group of branches. Correction coefficients $\alpha_i$ are modified in a same way, so that general power consumption P effectively corresponds to the sum $P_i$.

This new way of determining correction coefficients $\alpha_i$ thus assumes to know the individual power consumptions of the group. Thus, steps F1 to F4 of the determination method of FIG. 6 will have been applied to all the branches in the group.

At step F71, a general correction coefficient $\alpha_g$ is calculated according to the following equation:

$$\alpha_g = \frac{\sum_{i=1}^{n} P_i}{P}$$

Coefficient $\alpha_g$ is equal to the sum of the individual powers $P_i$ of all distribution branches (n branches), which have been corrected at step F6, divided by general power P.

Individual correction coefficients $\alpha_i$ are then updated (step F72), by general correction coefficient $\alpha_g$. The new value $\alpha_i'$ of the coefficients can be calculated as follows:

$$\alpha'_i = \frac{\alpha_i}{\alpha_g} \quad (2)$$

As previously, for each modification of coefficients $\alpha_i$, the correct values $P_i$ of the individual powers are calculated again, taking into account the coefficient values modified at step F72.

$$P_i = P'_i \times \alpha_i$$

As the end of this new correction, the monitoring system is generally balanced, that is, the sum of the individual power consumptions $P_i$ is equivalent to general power consumption P.

Thus, in this preferred embodiment, correction coefficients $\alpha_i$ are concurrently modified by the two algorithms through above relations (1) and (2).

Preferably, the algorithm of FIG. 7 is also launched once after the installation of monitoring system 8.

Figure 8:
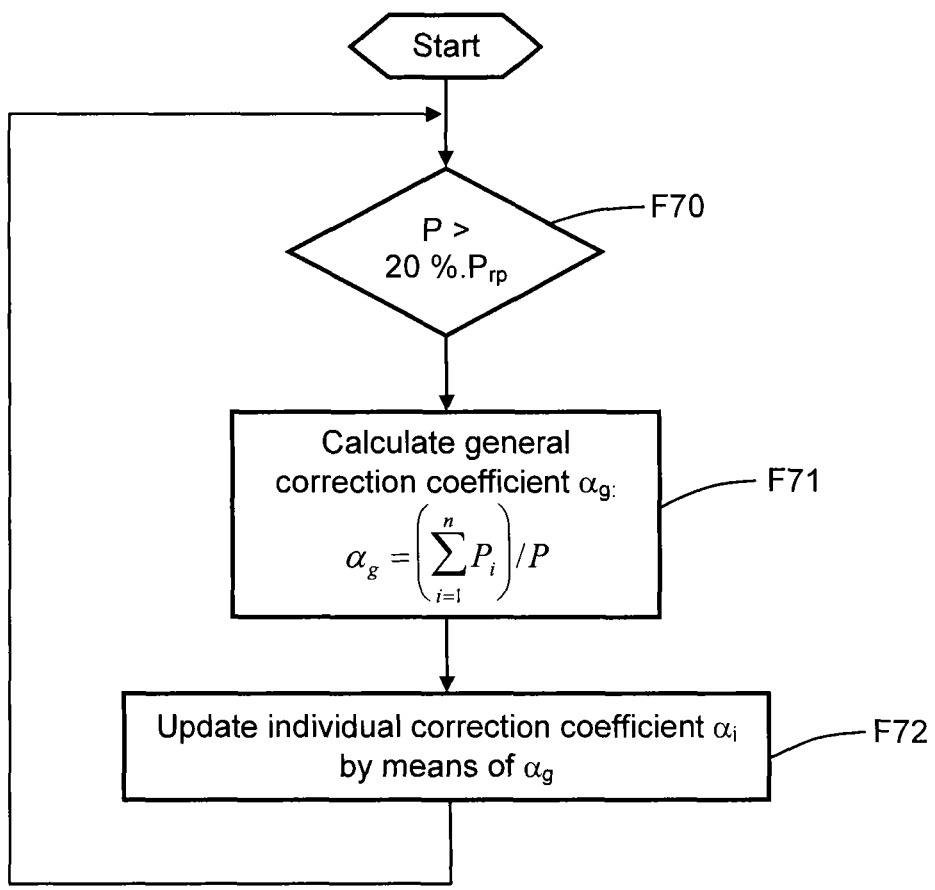
FIG. 8 shows a variation of the correction algorithm of FIG. 7.
Figure 9:
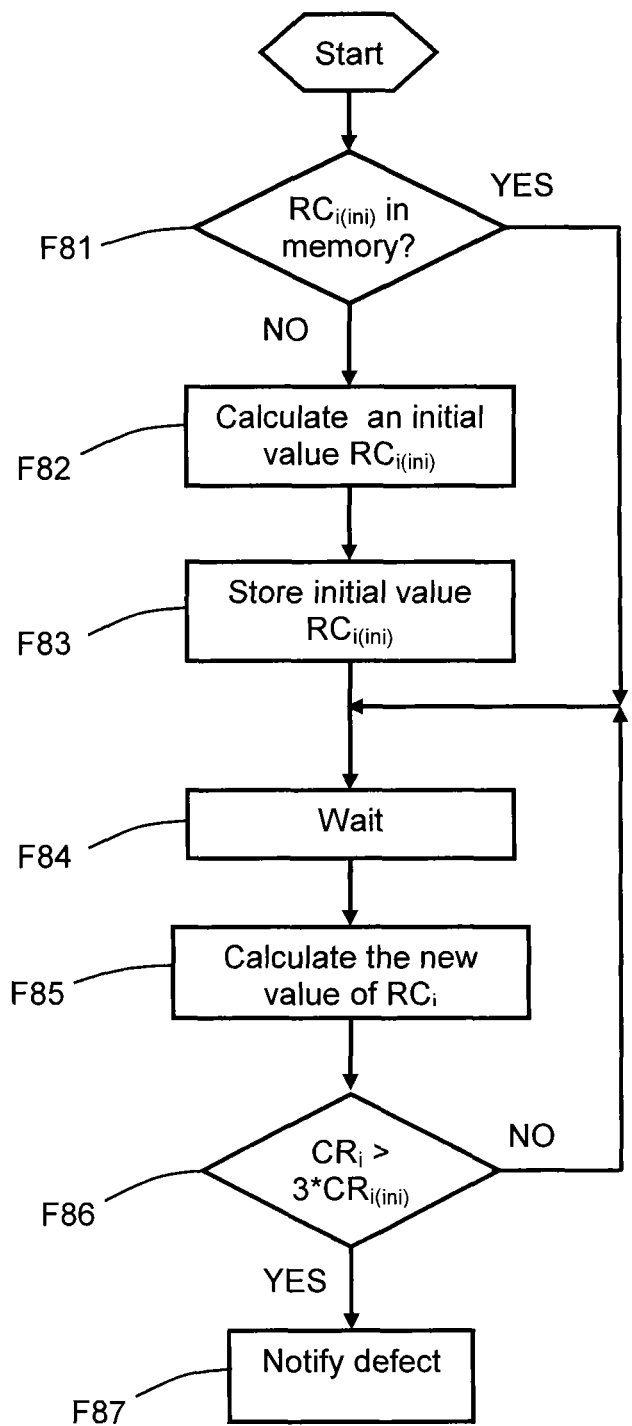
FIG. 9 shows a method of determining the contact resistance of a circuit breaker equipping each individual electric power distribution branch.

In an alternative embodiment shown in FIG. 8, the launching of the second algorithm may further be conditioned by a step F70 verifying whether the general power P measured by consumption meter 10 exceeds a threshold, for example, 20% of nominal power $P_{rp}$ of the branch group. This enables to avoid launching the algorithm too often, for too low variations.

If general power P is greater than the threshold (output YES), the general calibration of FIG. 7 takes place, that is, steps F71 and F72 are carried out as indicated hereafter. If general power P is lower than the threshold (output NO), nothing occurs: coefficients $\alpha_i$ will not be updated for the time being. Then, it is looped back to the beginning of step F70, to subsequently verify whether the condition is now fulfilled.

It can be observed that other electric parameters can be calculated, as soon as the accurate values $P_i$ of the individual power consumptions are available. In particular, it is possible to calculate the power factor $PF_i$ linked to each distribution branch and, accurately this time, the current in the branch, or more exactly a mean value $I_{Mi}$ of this current.

Power factor $PF_i$ of branch i can be written as follows:

$$PF_i = \frac{P_i}{\sqrt{P_i^2 + Q_i^2}}$$

Mean current $I_{Mi}$ flowing branch i can be written as:

$$I_{Mi} = \frac{P_i}{PF_i \times U}$$

As previously indicated, the dynamic correction of FIG. 6 aims at compensating for the variations of the contact resistance of the circuit breaker in the power consumption calculation, since the circuit breaker contacts may wear off or slightly displace after each opening/closing cycle.

It is actually possible to go even further and to directly calculate this contact resistance. This enables to monitor the wearing of the contacts along time and to start, if need be, circuit breaker maintenance operations. Further, the obtained contact resistance value may be used to calculate current images $I_i'$ based on the upstream-downstream voltage difference, at step F3 of the method of FIG. 5.

FIG. 8 shows a third algorithm, which is advantageously implemented in microprocessor μP of the central unit, with the calibration algorithms of FIGS. 6 and 7.

This algorithm is a simple and fast way to determine contact resistance $RC_i$ of a circuit breaker. In the same way as for the determination of power consumptions $P_i'$, the calculation of the contact resistance is based on the upstream-downstream voltage difference measured across the circuit breaker. This additional function can thus be obtained with the same measurement tools and the same calculation device as those described hereabove.

This third algorithm preferably comprises steps F81 to F83 relative to the determination of an initial value of the contact resistance of the circuit breaker, if such a value has not been previously recorded in the memory of microprocessor μP. Steps F81 to F83 are advantageously implemented when the circuit breaker is closed for the first time after the installation of the system. This initial value may be used as a reference to control the drift of the contact resistance along time.

Thus, at F81, the microprocessor verifies whether it has an initial value of the contact resistance, noted $RC_{i(ini)}$. If value $RC_{i(ini)}$ does not exist (output NO), the microprocessor proceeds to a step F82 of calculating this value, and then records it in its memory at a step F83.

The calculation is preferably performed by using the following equation:

$$RC_{i(ini)} = \frac{U - U_i}{I_{mi}},$$

where U is the voltage of the main upstream line, $U_i$ is the voltage of the individual distribution branch, and $I_{Mi}$ is the mean current flowing in this branch (which is also calculated by microprocessor μP).

If initial value $RC_{i(ini)}$ exists (output YES at F81), the algorithm skips steps F82-F83 and directly proceeds to a waiting phase F84. Waiting phase F84 defines a periodicity at which new values of contact resistance $RC_i$ are calculated. As an example, it may last for between 10 minutes and 1 hour.

After this waiting phase, microprocessor μP calculates at F85 a new value of contact resistance $RC_i$, by means of the new values of the voltage, U, $U_i$, and of mean current $I_{Mi}$ delivered by the system:

$$RC_i = \frac{U - U_i}{I_{Mi}}$$

At step F86, value $RC_i$ is compared with a threshold representative of a defect of the circuit breaker. This threshold is preferably a multiple of initial value $RC_{i(ini)}$, for example, three times initial value $RC_{i(ini)}$.

If value $RC_i$ is greater than the threshold (output YES at F86), an alarm is triggered at F87 to notify that the circuit breaker is defective. The circuit breaker of the branch may then be changed. If, however, value $RC_i$ is lower than the threshold (output NO), the circuit breaker is assumed to be reliable and no maintenance operation will take place. The algorithm of FIG. 8 loops back onto step F84, to subsequently perform a new control of the contact resistance (F85-F86).

In an alternative embodiment (not shown), after waiting phase F84 or as a replacement thereof, the calculation F85 of a new value may be triggered when mean current $I_{Mi}$ of the branch exceeds a threshold. Thus, the calculations of the contact resistance are more significant. This threshold is preferably a percentage of the nominal current of the branch, for example, 20% of this nominal current. The nominal current is defined as being the current for which the circuit breaker is calibrated, that is, the current threshold which makes the branch trip.

The invention claimed is:

1. Method of determining an individual power consumption in an electric installation comprising a group of individual electric power distribution branches and a main upstream line connecting the group of branches to an electric power supply, each individual electric power distribution branch comprising a circuit breaker, the method comprising the steps of:
    a) measuring the current flowing in the main upstream line and the voltage of the main upstream line;
    b) measuring the voltage of at least one individual distribution branch, downstream of the circuit breaker;
    c) determining the current flowing in the individual distribution branch based on the difference between the voltage of the main upstream line and the voltage of the individual distribution branch;
    d) calculating the individual power consumption of the individual distribution branch based on the current and on the voltage of the individual distribution branch;
    e) calculating the general power consumed by the group of branches based on the current and on the voltage of the main upstream line; and
    f) correcting the individual power consumption so that an instantaneous electric power consumption variation observed at the level of the individual distribution branch is equal to an instantaneous electric power consumption variation simultaneously observed at the level of the main upstream line,
    wherein step f) includes the sub-steps of:
        assigning an individual correction coefficient to the individual power consumption,
        simultaneously detecting a variation of the corrected individual power consumption and a variation of the general power,
        calculating a calibration coefficient equal to the ratio between the variations of the individual power consumption and of the general power,
        updating the individual correction coefficient using the calibration coefficient, and
        assigning the individual correction coefficient to the individual power consumption.

2. Method according to claim 1, wherein step f) is carried out each time the circuit breaker is closed.

3. Method according to claim 1, wherein steps b) to d) are implemented for all the individual electric power distribution branches.

4. Method according to claim 3, further comprising the step of:
    g) correcting the individual power consumption of each individual power consumption branch, so that the sum of the corrected individual power consumptions is equal to the general power.

5. Method according to claim 4, wherein step g) comprises the substeps of:
    assigning an individual correction coefficient to the individual power consumption of each individual distribution branch;
    calculating a general correction coefficient equal to the ratio between the sum of the corrected individual power consumptions and the general power;
    updating the individual correction coefficient of each branch using the general correction coefficient; and
    assigning the individual correction coefficient to the individual power consumption of each branch.

6. Method according to claim 1, wherein the calculation of the individual power consumption comprises calculating the individual active power and the individual reactive power.

7. Method according to claim 6, comprising steps of calculating a power factor of the individual distribution branch and a mean value of the current flowing through the individual distribution branch.

8. Method according to claim 7, comprising the steps of:
    calculating the contact resistance of circuit breaker of the individual branch, based on the difference between the voltage of the main upstream line and the voltage of the individual distribution branch, and on the mean value of the current flowing in the individual distribution branch;
    comparing the contact resistance with a threshold value; and
    triggering an alarm when the contact resistance is greater than the threshold value.

9. System of monitoring of an individual power consumption in an electric installation comprising a group of individual electric power distribution branches and a main upstream line connecting the group of branches to an electric power supply, each individual electric power distribution comprising a circuit breaker, the monitoring system comprising:
    a device configured to measure the current and the voltage at the level of the main upstream line and for measuring the voltage of at least one individual distribution branch downstream of the circuit breaker;
    a meter of the general power consumed by the group of branches from the current and the voltage of the main upstream line;
    a calculation device configured to calculate the individual power consumption of the individual distribution branch based on a current flowing through the individual distribution branch and on the voltage of the individual distribution branch; and
    a corrector configured to correct the individual power consumption, by correlation of the instantaneous electric power consumption variations simultaneously observed at the level of the individual distribution branch and of the main upstream line;
    wherein the calculation device is configured to calculate the current of the individual distribution branch based on the difference between the voltage of the main upstream line and the voltage of the individual distribution branch, and
    wherein the corrector is configured to:
        assign an individual correction coefficient to the individual power consumption,
        simultaneously detect a variation of the corrected individual power consumption and a variation of the general power, calculate a calibration coefficient equal to the ratio between the variations of the individual power consumption and of the general power,
update the individual correction coefficient using the calibration coefficient, and
assign the individual correction coefficient to the individual power consumption.

* * * * *